United States Patent
Fathimulla et al.

[11] Patent Number: 5,334,865
[45] Date of Patent: Aug. 2, 1994

[54] MODFET STRUCTURE FOR THRESHOLD CONTROL

[75] Inventors: Ayub Fathimulla, Ellicott City; Aina Olaleye, Columbia, both of Md.

[73] Assignee: Allied-Signal Inc., Morris Township, Morris County, N.J.

[21] Appl. No.: 738,416

[22] Filed: Jul. 31, 1991

[51] Int. Cl.$^5$ .................. H01L 29/784; H01L 29/205; H01L 29/804; H01L 29/06
[52] U.S. Cl. .................................... 257/192; 257/284; 257/289
[58] Field of Search .................... 357/23.2, 22, 55, 16; 257/192, 284, 289

[56] References Cited
U.S. PATENT DOCUMENTS

| | | | |
|---|---|---|---|
| 4,873,558 | 10/1989 | Antreasyan et al. | 357/23.2 |
| 5,043,777 | 8/1991 | Sriram | 357/23.2 |
| 5,124,762 | 6/1992 | Childs et al. | 257/289 |

*Primary Examiner*—Gene M. Munson
*Attorney, Agent, or Firm*—Howard G. Massung

[57] ABSTRACT

A MODFET structure having a semi-insulating substrate overlayed with an undoped semiconductor buffer layer of a first composition. The buffer layer is overlayed with an undoped semiconductor layer having a second composition different from the composition of the buffer layer. An etch stop layer having a composition different from the composition of spacer layer is formed on the spacer layer, which in turn is overlayed with a doped semiconductor layer having the same composition as the spacer layer. A gate well is selectively etched through the doped semiconductor layer using a gate mask and is terminated at the top surface of the etch stop layer. In a first embodiment, a gate electrode is deposited on the surface of the stop layer at the bottom of the gate well. In an alternate embodiment the etch stop layer at the bottom of the gate well is removed and a thin dielectric layer is formed between the spacer layer and the gate electrode.

7 Claims, 2 Drawing Sheets

MODFET STRUCTURE FOR THRESHOLD CONTROL

BACKGROUND OF THE INVENTION

1. Field of the Invention

The invention is related to MODFET structures and, in particular, to a MODFET structure having an etch stop layer to limit the thickness of the doped semiconductor layer.

2. Background

In conventional modulation doped field effect transistors, MODFET's, the threshold voltage $V_{th}$ depends upon the thickness and donor concentration of the doped semiconductor layer. For example, the threshold voltage for a doped aluminum gallium arsenide (AlGaAs) layer having a doping concentration of $1.0 \times 10^{18}$ varies as much as 6.0 millivolts per angstrom of thickness. Because of this, it is difficult to control the threshold voltage. Recently, as taught by T. Wada et al, Jap. J. Applied Physics, Vol. 26, pp. 213, 1985, semiconducto-insulator-semiconductor (SIS) devices on undoped aluminum gallium arsenide on an undoped gallium arsenide buffer layer have been fabricated which overcome this problem. In addition to good threshold voltage control, these devices show no I-V collapse which is observed in conventional structures. The MODFET structure disclosed herein is a modification of the conventional MODFET having the advantages of the SIS structure.

SUMMARY OF THE INVENTION

A MODFET or similar semiconductor device having a semi-insulating semiconductor substrate, an undoped semiconductor buffer layer disposed on the semi-insulator substrate, at least one undoped semiconductor spacer layer disposed on the buffer layer having a different composition than the buffer layer, an etch stop layer disposed on the spacer layer having a different composition than the spacer layer, and a doped semiconductor layer disposed on the etch stop layer having the same composition as the spacer layer. The MODFET further has a gate recess extending through the doped semiconductor layer to the etch stop layer, the gate well has a base defining a gate region on a top surface of the etch stop layer. A gate electrode is provided on the top surface of said etch stop layer at the base of said gate well, and source and drain electrodes are provided on the top surface of the doped semiconductor layer on opposite sides of the gate well.

In a first embodiment, the etch stop layer is a gallium arsenide layer sandwiched between an undoped aluminum gallium arsenide layer and a doped aluminum gallium arsenide layer. In an alternate embodiment, the etch stop layer is an undoped indium gallium arsenide layer sandwiched between an undoped indium phosphide spacer layer and a doped indium phosphide layer. In the alternate embodiment, the etch stop layer at the base of the gate recess is etched away and a thin dielectric layer is disposed between the top surface of the undoped indium phosphide layer and the gate electrode to form an MIS structure.

One advantage of the disclosed MODFET structure is the use of an etch stop layer to limit the depth of the etch of the gate well.

Another advantage is no implantation or high temperature annealing is required.

Still another advantage is that depletion mode devices can be fabricated on the same structure.

Still another advantage is that the threshold voltage is easier to control.

These and other objects will become more apparent from a reading of the detailed description of the invention in conjunction with the drawings.

DETAILED DESCRIPTION OF THE INVENTION

Figure 1:
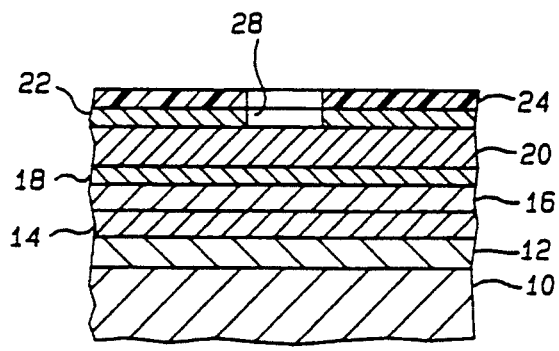
FIGS. 1–7 are cross-sectional views showing progressively the steps in the manufacture of an indium phosphide MODFET having an indium gallium arsenide etch stop layer between doped and undoped indium phosphide layers.
Figure 2:
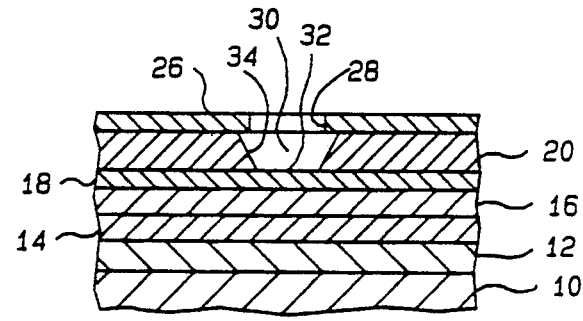

The detailed steps in making an indium phosphide MODFET structure having improved threshold voltage control are showing in FIGS. 1 through 7. FIG. 1 shows the multi-layer starting structure which comprises a semi-insulating base 10, such as indium phosphide (InP), on which is deposited an indium phosphide (InP) or aluminum indium arsenide (AlInAs) buffer layer 12 having a thickness in the range of 2000 to 5000 angstroms. An undoped indium gallium arsenide (In Ga As) layer 14 is deposited on top of the aluminium indium arsenide or indium phosphide buffer layer 12 to a thickness of approximately 500 angstroms, and an undoped indium phosphide (InP) spacer layer 16, 50 to 150 A° thick, is deposited on top of the indium gallium arsenide layer 14. An undoped indium gallium arsenide (InGaAs) etch stop layer 18 having a thickness ranging from 30 to 50 A° is formed on top of the undoped indium phosphide (InP) layer 16, and an n+ indium phosphide layer (n+InP) 20 approximately 3,000 angstroms thick is formed over the etch stop layer 18. The top surface of the n+ indium phosphide layer is overlayed with a dielectric layer 22 approximately 300 angstroms thick. The dielectric layer 22 may be a silicon dioxide (SiO$_2$) layer or aluminum nitride (AlN) layer. The dielectric layer 22 is reactive ion etched through using a photoresist mask 24 to form a gate mask 26 having an aperture 28, as shown in FIG. 2. The gate mask 26 delineates the gate region of the transistor.

After forming the gate mask 26, the photoresist mask is removed and the portion of the n+ indium phosphide layer 20 underlying the aperture 28 is selectively etched using a 1:4 solution of phosphoric acid (H$_3$PO$_4$) and hydrochloric acid (HCl). The depth of the etch, as shown in FIG. 2, is limited by the undoped indium gallium arsenide etch stop layer 18. The etching produces a gate well having an inverted trapezoidal cross-section, the top of which is wider than the base 32. The etching process is controlled so that the base 32 of etched gate well 30 is slightly larger than the gate aperture 28 and is aligned therewith. The side walls 34 of the gate well 30 diverge away from the base 32 and are shielded by the overhanging portion of the gate mask 26 surrounding the aperture 28.

Figure 3:
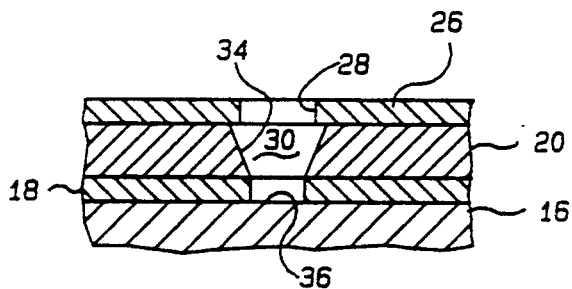

In the next step, as shown in FIG. 3, the etch stop layer 18 is selectively etched through to the undoped indium phosphide layer 18 using a phosphoric acid ($H_3PO_4$), peroxide ($H_2O_2$) and water ($H_2O$) etching solution. During this etching step, the base 32 of the gate well 30 is used as an etching mask. The undoped indium phosphide layer 16 acts as an etch stop for the phosphoric acid, peroxide and water etching solution, therefore this etching step automatically stops at the surface of the undoped indium phosphide layer 16.

Figure 4:
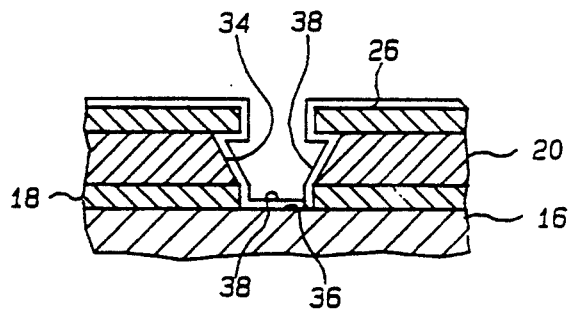
Figure 5:
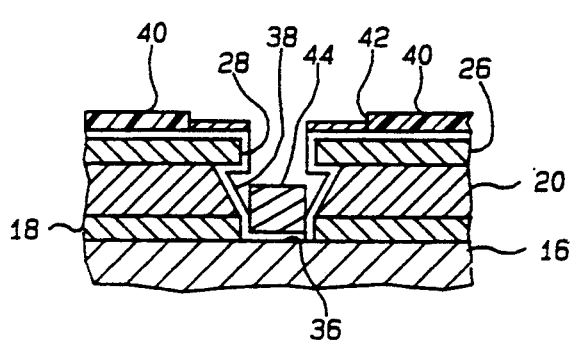

After etching through to the undoped indium phosphide layer 16, the bottom 36 of the gate well 30 is coated with a thin layer 38 of a dielectric material, such as aluminum nitride or silicon dioxide. This thin layer 38 of dielectric material, approximately 50 angstroms thick, is deposited by chemical vapor decomposition (CVD) and coats all exposed surfaces, including the side walls 34 of the gate well 30, as shown in FIG. 4. After the deposition of the dielectric layer 38, a photoresist mask 40 is formed on the top surface of the gate mask 26, as shown in FIG. 5. The photoresist mask 40 has an aperture 42 which circumscribes the aperture 28 of the gate mask and permits a metal gate electrode 44 to be deposited on the dielectric layer 38 overlaying the bottom 36 of the gate well 30. During the deposition of the gate electrode 44, the location of the gate electrode is determined by the aperture 28 of the gate mask 26. Thus, the gate electrode is self-aligned by the gate mask 26 used in etching the gate well 30. Any suitable metal or metal alloy, such as a gold germanium alloy, may be used to form the gate electrode 44.

Figure 6:
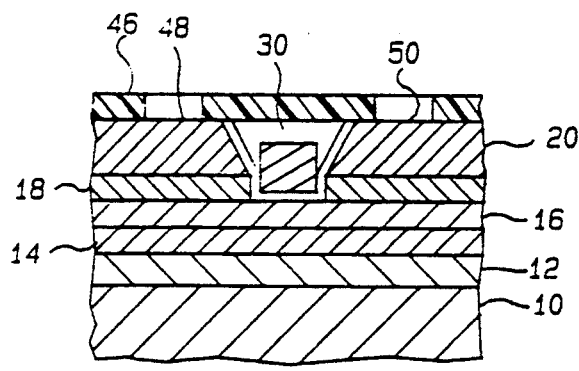
Figure 7:
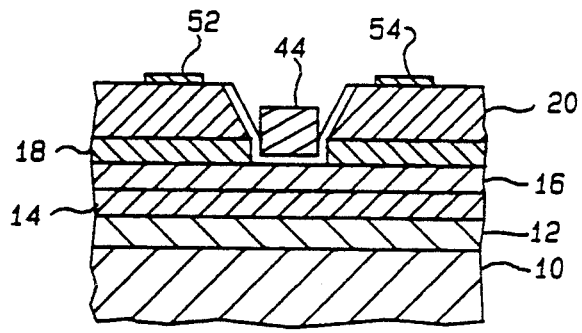

After depositing the gate electrode 44, the gate mask 26 is removed by a chemical etch and a third photoresist mask 46 is formed on top of n+ indium phosphate layer 20. The photoresist mask 46 covers the gate well 30 and delineates on either side of the gate well regions for source and drain electrodes 48 and 50 respectively, as shown in FIG. 6. Drain and source electrodes 52 and 54 respectively are then deposited on the surface of the n+ indium phosphide layer 20, as shown in FIG. 7, completing the semiconductor structure. As is known in the art, electrical contacts may be added to the gate, drain and source electrodes as required.

Figure 8:
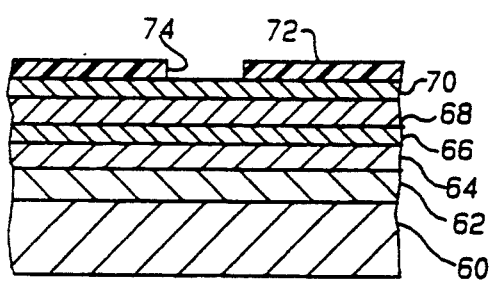
FIGS. 8–10 are cross-sectional views showing progressively the steps in the manufacture of an aluminum gallium arsenide MODFET having an undoped gallium arsenide etch stop layer between doped and undoped indium gallium arsenide layers.
Figure 9:
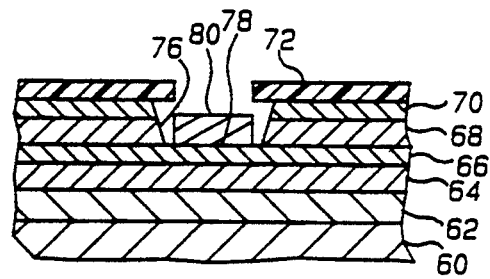
Figure 10:
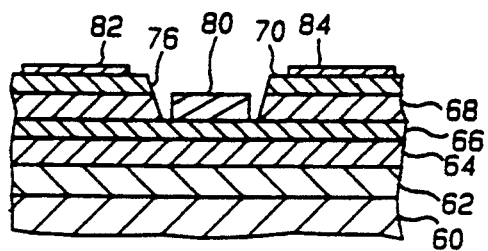

The invention is not limited to indium phosphide structures as shown in FIGS. 1-7, but also is applicable to aluminum gallium arsenide structures such as shown in FIGS. 8-10 as well as other structures and semi-conductor materials. Referring to FIG. 8, there is shown the starting structure of an aluminum gallium arsenide MODFET. In this starting structure, an undoped gallium arsenide (GaAs) buffer layer 62 is formed on the surface of a semi-insulating gallium arsenide (GaAs) substrate 60. An undoped aluminum gallium arsenide (AlGaAs) spacer layer 64 is formed on the buffer layer 62. On top of the undoped aluminum gallium arsenide spacer layer 64, a thin gallium arsenide etch stop layer 66 approximately 20-40 angstroms thick is formed. The gallium arsenide etch stop layer 66 serves the same function as the indium gallium arsenide layer 18 discussed relative to the embodiment shown in FIGS. 1-7. Alternatively, an indium gallium arsenide layer may be used as an etch stop as previously discussed. A doped aluminum gallium arsenide layer 68, approximately 300 angstroms thick, is formed on top of the etch stop layer 66. The doped aluminum gallium arsenide layer 68 is overlayed with a doped gallium arsenide layer 70 which functions as a cap to prevent the oxidation of the doped aluminium gallium arsenide layer 68.

In the initial step of the fabrication of the MODFET device, a photoresist mask 72 is formed on the top surface of the gallium arsenide cap layer 70 which has an aperture 74 delineating a gate region for the MODFET, as shown in FIG. 8.

Using the photoresist mask 72, a gate well 76 is selectively etched through the gallium arsenide cap layer 70 and the doped aluminum gallium arsenide layer 68 to the etch stop layer 66. The selective etching is terminated when the width of the base 78 of the gate well 76 is slightly larger than the width of the aperture 74, as shown in FIG. 9. As in the embodiment shown in FIGS. 1-7, the side walls of the gate well 76 are undercut and lie under the photoresist mask 72 as shown. The etch stop gallium layer or indium gallium layer 66 is etched. A gate electrode 80 is then formed on the top surface of the aluminum gallium arsenide etch stop layer 66 using the photoresist mask 72. Since both the gate well 76 and the gate electrode 80 are formed using the same mask 72, the gate electrode 80 is aligned within the gate well. The undoped gallium arsenide etch stop layer 66 has a high resistivity and acts as an insulator between the gate electrode 80 and the undoped aluminum gallium arsenide layer 66.

After the gate electrode 80 is formed, the photoresist mask 72 is removed and source and drain electrodes, 82 and 84 respectively, are formed on the top surface of the gallium arsenide cap layer 70 in opposite sides of the gate well 76. The gate electrode 80 is preferably a conductive metal alloy, such as titanium gold or titanium platinum.

A still further embodiment has a semi-insulating indium phosphide layer equivalent to layer 10 in FIG. 1 which is overlayed with an indium aluminum arsenide buffer layer. A 500 A° undoped indium phosphide layer is formed over the indium aluminum arsenide buffer. The indium aluminum arsenide buffer and undoped indium phosphide layer are equivalent to layer 12 and 14 of FIG. 1.

An undoped indium aluminum arsenide spacer layer is formed on top of the undoped indium phosphide layer. The undoped indium aluminum arsenide spacer layer and the doped indium aluminum arsenide layers correspond to layers 16 and 20 shown in FIG. 1. Finally a doped n+ indium gallium arsenide cap is formed on top of the doped indium aluminum arsenide layer.

The process for making the indium phosphide MODFET is basically the same as discussed relative to FIGS. 1-7.

After forming a gate mask, the portion of the n+, doped and undoped indium aluminum arsenide layers are removed by etching with a 6:1 solution of hydrochloric (HCl) a phosphoric ($H_3PO_4$) acid. The undoped indium phosphide will act as an etch stop as previously described. A gate dielectric layer such as a thin layer of silicon dioxide ($SiO_2$) is applied over the exposed portion of the undoped indium phosphide layer. The gate dielectric layer is equivalent to the gate dielectric layer 38 shown in FIG. 4. The MODFET is completed by depositing a gate electrode 44 and source and drain electrodes 48 and 50 as shown in FIGS. 5-7.

It is intended that the method described above is applicable to not only fabricating modulation doped FET's (MODFET's), but is also applicable to making heterojunction insulated gate FET's (HIGFET's), high electron mobility transistors (HEMT), selectively doped heterojunction transistors (SDHT), and two-dimensional electron gas FET's (TEGFET's). Further, it is not intended that the invention be limited to the materials and semiconductor structures shown in the drawings and discussed in the specification. It is recognized that those skilled in the art will be able to use other semiconductor materials for etch stop layers, or make other changes within the spirit of the invention as set forth in the appended claims.

What is claimed is:

1. A semiconductor device comprising:
   a semi-insulating semiconductor substrate;
   an undoped semiconductor buffer layer disposed on said semiconductor substrate;
   at least one undoped semiconductor spacer layer disposed on said buffer layer, one of said at least one spacer layer being of a different composition than said buffer layer;
   an etch stop layer disposed on said at least one spacer layer, said etch stop layer being of a different composition than said at least one spacer layer;
   a doped semiconductor layer disposed on said etch stop layer, said doped semiconductor layer having the same composition as one of said at least one spacer layer;
   a gate well etched through at least said doped semiconductor layer to said etch stop layer, said gate well having a base defining a gate region;
   a gate electrode disposed on said base of said gate well; and
   source and drain electrodes disposed on a top surface of said doped semiconductor layer on opposite sides respectively of said gate well.

2. The semiconductor device of claim 1 wherein:
   said semi-insulating substrate is a semi-insulating gallium arsenide substrate;
   said buffer layer is an undoped gallium arsenide buffer layer;
   said at least one spacer layer is an undoped aluminium gallium arsenide layer;
   said etch stop layer is an undoped gallium arsenide layer; and
   said doped semiconductor layer is a doped aluminium gallium arsenide layer.

3. The semiconductor device of claim 1 further including a doped semiconductor cover layer having the same composition as said buffer layer disposed on said doped semiconductor layer and wherein said source and drain electrodes are disposed on said doped semiconductor cover layer.

4. The semiconductor device of claim 2 further including an n+ gallium arsenide cover layer disposed in said doped aluminum gallium arsenide layer to protect said doped aluminum gallium arsenide layer from oxidizing and wherein said source and drain electrodes are disposed on said n+ gallium arsenide cover layer.

5. The semiconductor device of claim 1 wherein:
   said semi-insulating substrate is a semi-insulating indium phosphide substrate;
   said buffer layer is an indium phosphide layer;
   said at least at least one undoped semiconductor spacer layer comprises an undoped indium gallium arsenide layer disposed on said buffer layer and an undoped indium phosphide layer disposed on said undoped indium gallium arsenide layer;
   said etch stop layer is an undoped indium gallium arsenide layer; and
   said doped semiconductor layer is a doped indium phosphide layer.

6. The semiconductor device of claim 5 wherein said gate well is further etched through said stop etch layer and wherein said base of said gate well is defined by a top surface of said undoped indium phosphide layer.

7. The semiconductor device of claim 5 having a thin dielectric layer disposed between said gate electrode and said base of said gate well.

* * * * *